US011349487B2

(12) United States Patent
Leonard et al.

(10) Patent No.: US 11,349,487 B2
(45) Date of Patent: May 31, 2022

(54) PHASE SYNCHRONIZATION UPDATES WITHOUT SYNCHRONOUS SIGNAL TRANSFER

(71) Applicant: Analog Devices International Unlimited Company, Limerick (IE)

(72) Inventors: Alexander Leonard, Raleigh, NC (US); Lu Wu, Summerfield, NC (US); Christopher Mayer, Dover, MA (US); Gord Allan, Ottawa (CA)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 0 days.

(21) Appl. No.: 17/218,695

(22) Filed: Mar. 31, 2021

(65) Prior Publication Data
US 2022/0045685 A1 Feb. 10, 2022

Related U.S. Application Data

(60) Provisional application No. 63/062,561, filed on Aug. 7, 2020.

(51) Int. Cl.
*H03L 7/099* (2006.01)
*H03L 7/093* (2006.01)
(Continued)

(52) U.S. Cl.
CPC .............. *H03L 7/093* (2013.01); *H03L 7/091* (2013.01); *H03L 7/0992* (2013.01); *H03L 7/0994* (2013.01); *H03L 7/185* (2013.01)

(58) Field of Classification Search
CPC ......... H03L 7/00; H03L 7/099; H03L 7/0992; H03L 7/0994; H03L 7/185; H03J 7/00
See application file for complete search history.

(56) References Cited

U.S. PATENT DOCUMENTS 9,037,893 B2 5/2015 Holford et al.
9,288,286 B2 3/2016 Keyes, Jr. et al.
(Continued)

FOREIGN PATENT DOCUMENTS

WO 2018126142 A1 7/2018

OTHER PUBLICATIONS

*High-Channel-Count JESD204B Clock Generation Reference Design for RADAR and 5G Wireless Testers*, TI Designs: TIDA-01023, © 2018, Texas Instruments Inc., 24 pages.
(Continued)

*Primary Examiner* — Hai L Nguyen
(74) *Attorney, Agent, or Firm* — Patent Capital Group

(57) ABSTRACT

Embodiments of the present disclosure provide systems and methods for realizing phase synchronization updates based on an input system reference signal SYSREF without the need to synchronously distribute the SYSREF signal on a high-speed domain. In particular, phase synchronization mechanisms of the present disclosure are based on keeping a first phase accumulator in the device clock domain and using a second phase accumulator in the final digital clock domain to asynchronously transmit phase updates to the final digital clock domain. Arrival of a new SYSREF pulse may be detected based on the counter value of the first phase accumulator, which value is asynchronously transferred and scaled to the second phase accumulator downstream. In this manner, even though the SYSREF signal itself is not synchronously transferred to the second phase accumulator, the phase updates from the SYSREF signal may be transferred downstream so that the final phase may be generated deterministically.

20 Claims, 7 Drawing Sheets

(51) Int. Cl.
    *H03L 7/091*    (2006.01)
    *H03L 7/185*    (2006.01)

(56) References Cited

U.S. PATENT DOCUMENTS

| | | |
|---|---|---|
| 9,465,404 B2 * | 10/2016 | Ali .......................... G06F 1/10 |
| 2013/0249719 A1 | 9/2013 | Ryan et al. |
| 2016/0041579 A1 | 2/2016 | Ali et al. |

OTHER PUBLICATIONS

Hsia, *DAC3XJ8x Device Initialization and SYSREF Configuration*, Application Report SLAA696, Sep. 2017, Texas Instruments, 21 pages.
*Synchronizing Multiple AD9361 Devices*, downloaded on Aug. 3, 2020, https://wiki.analog.com/resources/eval/user-guides/ad-fmcomms5-ebz/multi-chip-sync, 6 pages.
Jones et al., *Power-Up Phase Determinism Using Multichip Synchronization Features in Integrated Wideband DACs and ADCs*, Analog Devices, Technical Article, © 2021, 9 pages.
*JESD204B Survival Guide, Practical JESD204B Technical Information, Tips and Advice from the World's Data Converter Market Share Leader*, Analog Devices, Inc., © 2014, 78 pages.

* cited by examiner

PHASE SYNCHRONIZATION UPDATES WITHOUT SYNCHRONOUS SIGNAL TRANSFER

CROSS REFERENCE TO RELATED APPLICATIONS

This application claims the benefit of and priority from U.S. Patent Application No. 63/062,561, filed Aug. 7, 2020, titled "PHASE SYNCHRONIZATION UPDATES WITHOUT SYNCHRONOUS SIGNAL TRANSFER," the disclosure of which is hereby incorporated by reference herein in its entirety.

TECHNICAL FIELD OF THE DISCLOSURE

The present disclosure relates generally to electronic devices and, more particularly, to systems and methods for synchronization of clocked signals among multiple electronic components using phase synchronization updates.

BACKGROUND

The competitive nature of the integrated circuit (IC) industry and market forces tend to encourage producing digital logic in the most advance process nodes with the highest speed clocking available. The clocking is often driven by a phase-locked-loop (PLL), configured to output a clock signal (typically referred to as a "PLL reference clock signal" or simply a "PLL clock" or "PLL output") based on a lower-speed device clock signal, where the device clock signal is a reference clock signal from a primary IC input. Multiple applications, be it precision instrumentation or wireless communications, often require synchronizing digital components between multiple ICs (or within a single IC). This is sometimes referred to as multi-chip synchronization/sync (MCS). These components often rely on a digital counter (typically referred to as a "phase accumulation counter" or a "phase accumulator"), where an arrival of a pulse of a system reference (SYSREF) signal resets the phase of the counter-based component (for that reason the SYSREF signal is sometimes also referred to as a "reset signal"). An example of this is a numerically-controlled oscillator (NCO), which is based on using such a phase accumulation counter.

Conventionally, the process of MCS involves distributing a synchronous SYSREF signal along with a PLL reference clock signal to multiple chips in the system. When the PLL is run at cutting-edge frequencies, it can be difficult to distribute the SYSREF signal, synchronously, throughout the IC. To get around this requirement, the high-speed clock output of the PLL is sometimes gated (i.e., prevented from being distributed further, beyond the gate) such that downstream logic can be reset in a "clock-off" mode before the SYSREF signal triggers a synchronous ungating of the clock signal to be distributed. Unfortunately, such an approach prevents further SYSREF-based phase updates without disturbing the downstream logic by altering the clock and/or reset signals.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
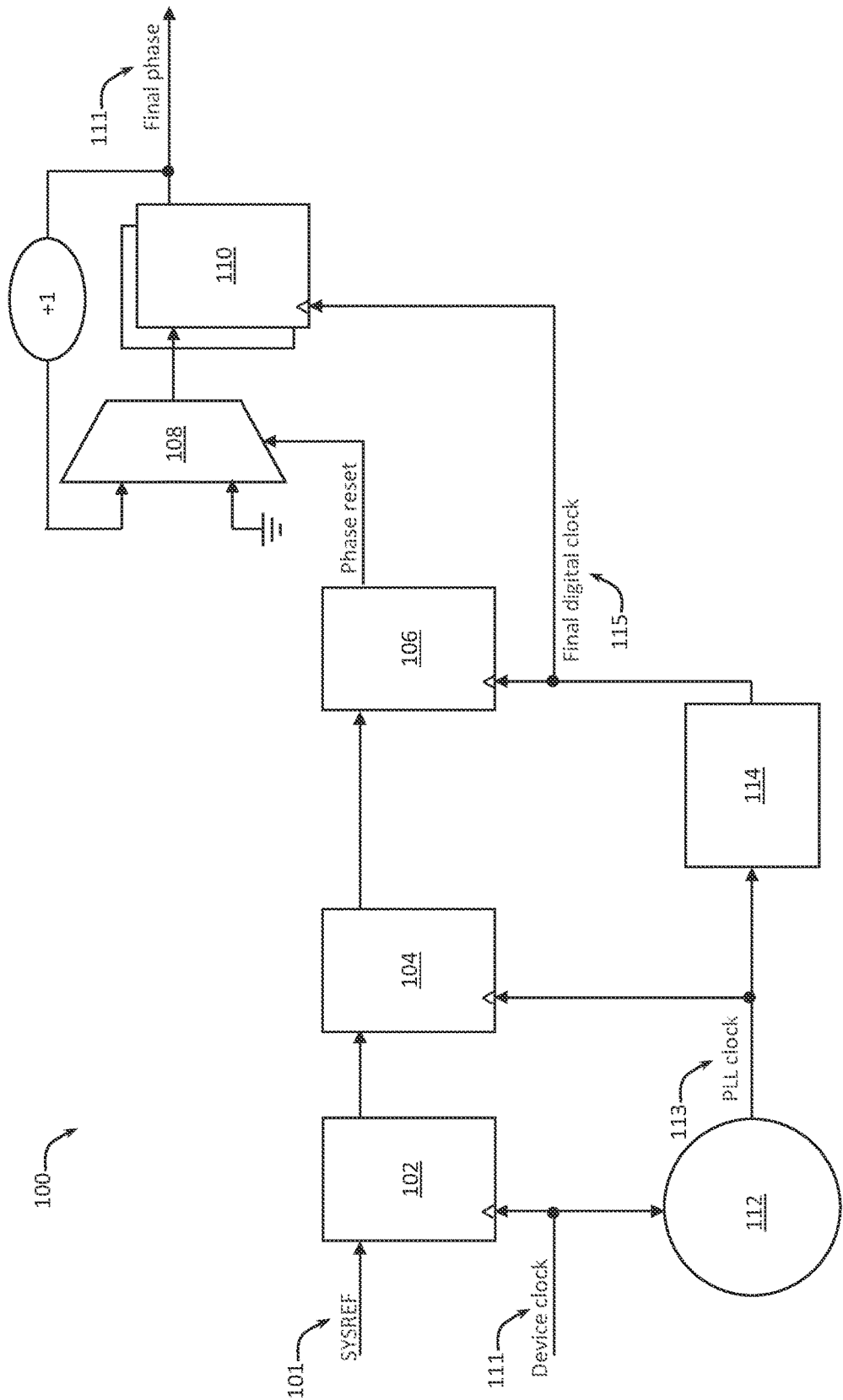
FIG. 1 provides a schematic illustration of a conventional system for providing phase synchronization updates.

Embodiments of the present disclosure provide systems and methods for realizing phase synchronization updates based on an input SYSREF signal without the need to synchronously distribute the SYSREF signal. In the context of the present disclosure, a SYSREF signal may be described as being distributed "synchronously" if it is distributed to various IC components in a manner that a predefined delay is substantially maintained between an arrival of a pulse in the SYSREF signal and a final digital clock signal that is generated based on the PLL clock in a high-speed domain (e.g., when the SYSREF signal is clocked at a high-speed clock). Synchronous distribution of the SYSREF signal in the high-speed domain can often be difficult due to the tight setup and hold restrictions of very-high-speed digital signal transfer. Additionally, providing phase synchronization updates without synchronous signal transfer may advantageously reduce or eliminate the need to synchronously pass the SYSREF signal over long conductive traces within an IC. In particular, phase synchronization mechanisms of the present disclosure are based on keeping a first phase accumulator in the final digital clock domain (i.e., clocked at the final digital clock, which is generated based on the PLL output clock) and using a second phase accumulator in the device clock domain (i.e., clocked at the device clock, which is typically much slower than the PLL output clock) to asynchronously transmit phase updates to IC components operating in the final digital clock domain. As used herein, the term "phase update" (which may be used interchangeably with the term "phase synchronization update") refers to information indicative of the time of arrival of a new pulse of the SYSREF signal, which information indicates a new phase (hence, it is an update) that needs to be distributed to other devices. In some embodiments, the first phase accumulator may be a local multiframe clock (LMFC) counter used for JESD operation and, therefore, is referred to in the following as an "LMFC phase counter" or, simply, an "LMFC counter." The second phase accumulator may be another phase counter and may be referred to in the following as a "shadow phase accumulator" or a "shadow counter." In some embodiments, the shadow counter may have a programmable reset period to allow for an integer or a power-of-2 phase relationship with the LMFC counter. The LMFC counter may be configured to generate a first phase update based on (e.g., by being clocked at) the final digital clock signal. To that end, the LMFC counter may be configured to count clock cycles of the final digital clock signal. The shadow counter may be configured to generate a second phase update based on (e.g., by being clocked at) the device clock signal. To that end, the shadow counter may be configured to count clock cycles of the device clock signal. Each of the first phase update and the second phase update is indicative of an arrival of a pulse of the SYSREF signal. Arrival of a new SYSREF phase (i.e., arrival of a new pulse of the SYSREF signal on an unexpected device clock cycle) may then be detected based on the counter value of the shadow counter, the value of which may be asynchronously transferred (i.e., transferred in a way that does not require maintaining a fixed transfer delay with respect to the final digital clock) to the final digital clock domain and scaled to the counts of the LMFC counter to provide the final phase update (denoted in the present drawings as "final phase"). In other words, the final phase update indicative of the arrival of a new SYSREF pulse may be generated based on the phase update provided by the value of the shadow counter, in addition to the phase update provided by the value of the LMFC counter. In this manner, even though the SYSREF signal itself is not synchronously transferred to the LMFC counter as was done in conventional implementations, the phase updates from the SYSREF signal may be transferred downstream (i.e., towards the LMFC counter and other IC components clocked at the final digital clock signal) deterministically so that the final phase update may be generated and used by the system to synchronize various IC components to the SYSREF signal. For example, in some embodiments, the final phase updates may be used by different components of a JESD system to determine when to start a new multiframe boundary within the framing operation described by the JESD204 specification.

While embodiments described herein may relate to MCS via an input SYSREF signal, systems and methods for providing phase synchronization updates without synchronous signal transfer, described herein, may be used to transfer phase updates between any type of phase accumulators within an IC, particularly if the phase accumulators are separated in a way that may make it difficult to synchronously transfer a phase update signal (e.g., difficult because of the high-speed PLL).

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

As will be appreciated by one skilled in the art, aspects of the present disclosure, in particular aspects of providing phase synchronization updates without synchronous signal transfer as proposed herein, may be embodied in various manners—e.g., as a method, a system, a computer program product, or a computer-readable storage medium. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Functions described in this disclosure may be implemented as an algorithm executed by one or more hardware processing units, e.g., one or more microprocessors of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing transceivers, e.g., RF transceivers, receivers, transmitters, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the select examples.

Figure 2:
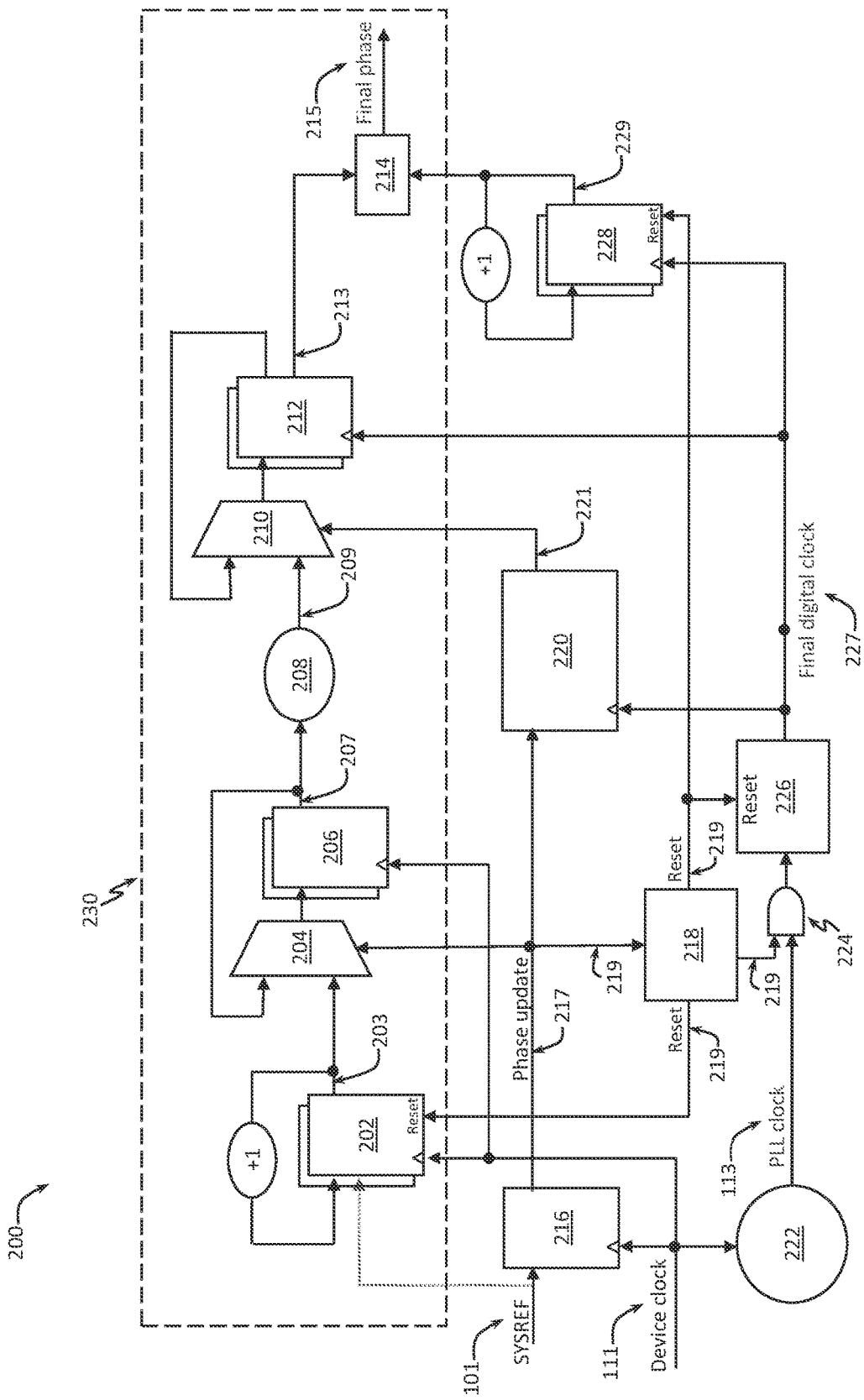
FIG. 2 provides a schematic illustration of a system configured to provide phase synchronization updates without synchronous signal transfer, according to some embodiments of the present disclosure.

In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. In general, while some drawings provided herein illustrate various aspects of providing phase synchronization updates without synchronous signal transfer, and systems in which such circuits may be implemented, details of these systems may be different in different embodiments. For example, various components of systems for providing phase synchronization updates without synchronous signal transfer, presented herein, may have further components included therein, or coupled thereto, which are not specifically shown in the drawings, such as logic, storage, passive elements (e.g., resistors, capacitors, inductors, etc.), or other elements (e.g., transistors, etc.). In another example, details shown in some of the drawings, such as the particular arrangement and example implementation details of various components of systems for providing phase synchronization updates without synchronous signal transfer, presented herein (e.g., a synchronization block realized by a sequence of two flip-flops as shown in FIG. 2, etc.) and/or the particular arrangement of coupling connections (e.g., coupling connections using multiplexers shown in FIG. 2, etc.) may be different in different embodiments, with the illustrations of the present drawings providing only some examples of how these components may be used together to realize providing phase synchronization updates without synchronous signal transfer. In yet another example, although some embodiments shown in the present drawings illustrate a certain number of components (e.g., a certain number of flip-flops shown in FIG. 2), it is understood that these embodiments may be implemented with any number of these components in accordance with the descriptions provided herein. Furthermore, although certain elements such as various elements of systems for providing phase synchronization updates without synchronous signal transfer, e.g., the system shown in FIG. 2, may be depicted in the drawings as communicatively coupled using a single depicted line, in some embodiments, any of these elements may be coupled by a plurality of conductive lines such as those that may be present in a bus, or when differential signals are involved.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the terms "circuit" or "circuitry" (which may be used interchangeably) refer to one or more passive and/or active components that are arranged to cooperate with one another to provide a desired function. Sometimes, in the present descriptions, the term "circuit" may be omitted (e.g., a PLL circuit may be referred to simply as a "PLL," etc.). Similarly, sometimes, in the present descriptions, the term "signal" may be omitted (e.g., a SYSREF signal may be referred to simply as a "SYSREF," etc.). If used, the terms "substantially," "approximately," "about," "around," etc., may be used to generally refer to being within +/−20% of a target value, e.g., within +/−10% of a target value, based on the context of a particular value as described herein or as known in the art.

Conventional Implementation of Providing Phase Synchronization Updates

FIG. 1 provides a schematic illustration of a conventional system 100 for providing phase synchronization updates. As shown in FIG. 1, a SYSREF signal 101 may go through a series of digital flip-flops (DFFs) or registers (shown in FIG. 1 as DFF 102, DFF 104, and DFF 106, although there may be more flip-flops in the path of the SYSREF signal 101 in other implementations) in order to avoid ambiguity and be transmitted synchronously to an LMFC counter 110 that is configured to generate/output a final phase 111 to be used by the JESD system to determine when to start a new multiframe boundary within the framing operation described by the JESD204 specification. In particular, from the last flip-flop (DFF 106 for the example shown in FIG. 1), the SYSREF signal 101 is provided to a multiplexer 108. The multiplexer 108 is configured to reset the count of the LMFC counter 110 when it detects a new pulse in the SYSREF signal provided to the multiplexer 108 (that is why the signal provided from last flip-flop 106 to the multiplexer 108 is labeled in FIG. 1 as "phase reset"). The final phase 111 is then output by the LMFC counter 110 (which may include logic to generate such an output), the final phase 111 being a phase update indicative of an arrival of a pulse of the SYSREF signal 101.

The system 100 also illustrates various clock signals at which different components of the system 100 are operating (i.e., at which the different components are clocked at), as well as clock inputs for these components (a clock input for a component is shown in FIG. 1 and the subsequent drawings as a small triangle at a periphery of a box illustrating the component, to which an arrow with a respective clock signal is pointing to). For example, a device clock signal 111 is illustrated in FIG. 1 to be the clock signal for the flip-flop 102 because the arrow with the device clock signal 111 is pointing to the triangle illustrating the clock input of the flip-flop 102. The device clock signal 111 may be a relatively low-speed clock. The device clock signal 111 is also provided to a PLL 112, configured to generate a PLL clock signal 113 having a frequency greater than that of the device clock signal 101. The flip-flop 104 is clocked at the PLL clock signal 113. FIG. 1 further illustrates a clock divider 114, configured to generate a final digital clock signal 115 based on the PLL clock signal 113 provided thereto. Each of the flip-flop 106, the multiplexer 108, and the LMFC counter 110 is clocked at the final digital clock signal 115.

Thus, as shown in FIG. 1, at first, the SYSREF signal 101 is clocked at the relatively low-speed device clock 111, at the flip-flop 102. However, then the SYSREF signal 101 is passed to a peripheral PLL flip-flop, i.e., the flip-flop 104, where it is clocked at a relatively high-speed PLL clock signal 113 generated by the PLL 112. From the flip-flop 104 on, it may become very difficult to pass the SYSREF signal 101 synchronously to the LMFC counter 110 to generate the final phase signal 111 based on the phase update of the SYSREF signal 101.

Providing Phase Synchronization Updates without Synchronous Signal Transfer

Embodiments of the present disclosure propose systems and methods for providing the phase updates of the SYSREF signal without the need to distribute the SYSREF signal to the LMFC counter in a high-speed domain of the final digital clock signal.

FIG. 2 provides a schematic illustration of a system 200 configured to provide phase synchronization updates without synchronous signal transfer, according to some embodiments of the present disclosure. In contrast to conventional implementations, e.g., as shown in FIG. 1, the system 200 includes components 202-214, which may be seen as a part of a shadow block 230, the shadow block 230 illustrated in FIG. 2 with a dashed rectangular contour. Together with a state machine 218, a synchronization component 220, and a gate 224, the components of the dashed block 230 serve to enable providing phase updates of the SYSREF signal without synchronous transfer of the SYSREF signal to the LMFC counter 228. In some embodiments, components of the system 200 besides the shadow counter 202 and the LMFC counter 228 may be considered to be a "phase update circuit" of the system 200.

In the following, first, coupling between various components is described, follow by a description of the timing diagrams shown in FIGS. 3 and 4 to further illustrate the functionality of the various components of the system 200.

As shown in FIG. 2, the SYSREF signal may first be received by a flip-flop 216, similar to the flip-flop 102 shown in FIG. 1, clocked at the device clock 111. The device clock 111 is provided to a PLL 222, similar to the PLL 112, configured to generate a higher-speed PLL output clock 113 based on the lower-speed device clock 111. As shown in FIG. 2, the PLL output clock is provided to a first input of the gate 224. A second input of the gate 224 is coupled to the output of the state machine 218, and an output of the gate 224 is coupled to a clock divider 226. The clock divider 226 may be similar to a conventional clock divider, e.g., similar to the clock divider 114 shown in FIG. 1, configured to generate a final digital clock signal 227 based on the PLL clock signal 113 provided thereto, except that now the PLL clock signal 113 is provided to the clock divider 226 via the gate 224. In some embodiments, the gate 224 may be an AND gate (or may include a plurality of logic elements configured to realize the AND gate functionality).

Turning to the details of the block 230, similar to the flip-flop 216, a shadow counter 202 may also be configured to operate at the device clock signal 111, as illustrated in FIG. 2 with an arrow from the device clock signal 111 to the clock input of the shadow counter 202. To that end, when the system 200 is being initialized and receives one of the first pulses of the SYSREF signal (e.g., when the system 200 receives the very first pulse, or one of the first pulses of the SYSREF signal), the system 200 may be configured to reset the shadow counter 202, which may be done in a plurality of ways. This is illustrated in FIG. 2 with a dotted arrow from the SYSREF to the shadow counter 202, although in specific implementations it does not have to be done directly and may, e.g., be done via the state machine 218 that is coupled to the shadow counter 202, as illustrated in FIG. 2 with an arrow from the state machine 218 to the shadow counter 202. The shadow counter 202 may be configured to count the cycles of the device clock signal 111 and provide its output 203 to a multiplexer 204. An output of the multiplexer 204 may be provided to a transmit copy component/circuit 206, where an output 207 of the transmit copy component 206 may be provided both as a second input to the multiplexer 204 and to an optional scaling component/circuit 208. The transmit copy component 206 may also be configured to operate at the device clock 111, as illustrated in FIG. 2 with an arrow from the device clock 111 to the clock input of the transmit copy component 206. An output 209 of the scaling component 208 may be provided to a multiplexer 210. If the scaling component 208 is not implemented, then the transmit copy component output 207 may be provided as an input to the multiplexer 210. The multiplexer 210 may be configured to receive an output 221 of the synchronization component 220, as illustrated in FIG. 2 with an arrow from the synchronization component 220 to the multiplexer 210. An output of the multiplexer 210 may be provided to a receive copy component/circuit 212, where an output 213 of the receive copy component 212 may be provided both as a second input to the multiplexer 210 and to a combiner 214 (e.g., an adder) configured to generate a final phase 215 based on the receive copy component output 213 and an output 229 of the LMFC counter 228 (e.g., by adding the outputs 213 and 229). The receive copy component 212 may be configured to operate at the final digital clock 227 generated by the clock divider 226, as illustrated in FIG. 2 with an arrow from the final digital clock signal 227 to the clock input of the receive copy component 212.

Turning back to the flip-flop 216, an output of the flip-flop 216 is indicative of the phase updates in the SYSREF signal, as illustrated in FIG. 2 with the output of the flip-flop 216 being labeled as "Phase update." As shown in FIG. 2, said output may be provided to each of the state machine 218, the synchronization component 220, and the multiplexer 204. The synchronization component 220 may be configured to operate at the final digital clock 227 generated by the clock divider 226, as illustrated in FIG. 2 with an arrow from the final digital clock to the clock input of the synchronization component 220. In some embodiments, the synchronization component 220 may be implemented as a series of two flip-flops or registers one after the other, although in other embodiments, the synchronization component 220 may be implemented in any other manner that allows the synchronization component 220 to transfer an asynchronous input (the phase update output of the flip-flop 216 in this case) to the output 221 of the synchronization component 220, which can be clocked synchronously with the final digital clock 227. In this case, the phase update output by the flip-flop 216 will be captured by receive copy component 212, via a path through the multiplexer 210, as illustrated in FIG. 2, which is running synchronously on the final digital clock 227.

As shown in FIG. 2, an output 219 of the state machine 218 may be provided to each of the shadow counter 202, the gate 224, the clock divider 226, and the LMFC counter 228. The state machine 218 may be configured to receive the SYSREF signal 101 and the state machine output 219 may be indicative of the phase updates of the SYSREF signal. The state machine 218 may be seen as a logic configured to control the operation of the shadow counter 202, the gate 224, the clock divider 226, and the LMFC counter 228 for the purposes of a portion of the MCS procedure that is run at start-up of the system 200. In particular, the state machine 218 may be seen as a logic configured to control the reset of the shadow counter 202, the clock divider 226, and the LMFC counter 228 based on the receipt of an initial phase (i.e., of an initial pulse) of the SYSREF signal 101. With respect to the gate 224, the state machine 218 may be configured to control, based on the receipt of the initial pulse of the SYSREF signal 101, when the gate 224 passes the PLL clock 113 to the clock divider 226 to generate the final digital clock 227. The LMFC counter 228 may be configured to operate at the final digital clock 227 generated by the clock divider 226, as illustrated in FIG. 2 with an arrow from the final digital clock to the clock input of the LMFC counter 228. Thus, the LMFC counter 228 may be configured to count the cycles of the final digital clock 227 provided thereto from the clock divider 226 and be reset when needed by the state machine 218. The output 229 of the LMFC counter 228 may be provided to the combiner 214, as illustrated in FIG. 2 with an arrow from the LMFC counter 228 to the combiner 214.

Figure 3:
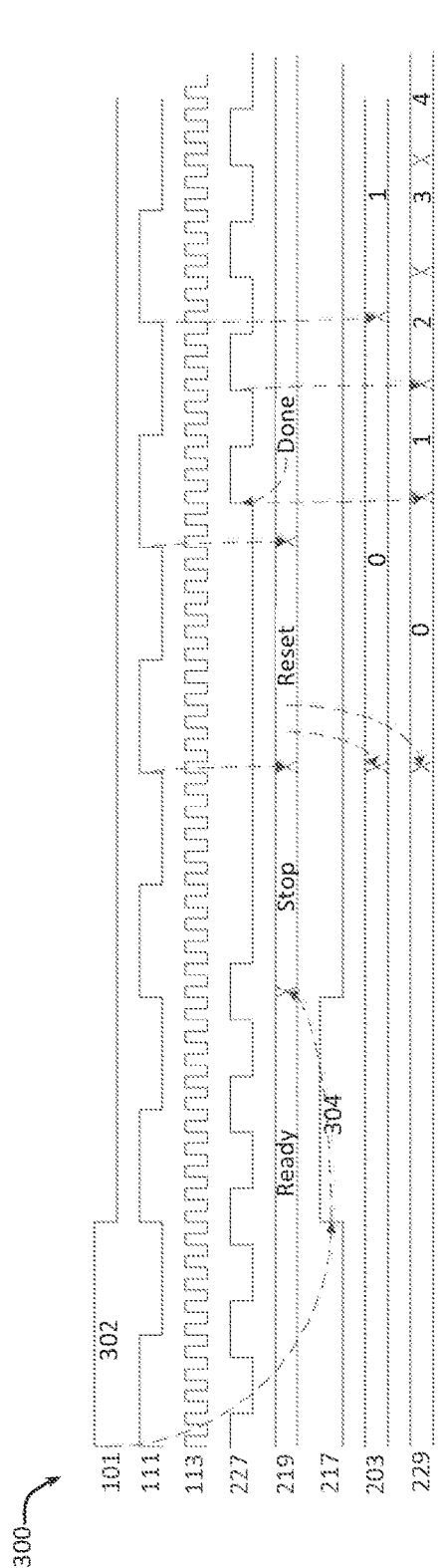
FIG. 3 provides a timing diagram illustrating how multiple phase accumulators may be synchronized during an MCS procedure, according to some embodiments of the present disclosure.

FIG. 3 provides a timing diagram 300 illustrating how multiple phase accumulators in the chip (including clock dividers) may be synchronized during an MCS procedure, according to some embodiments of the present disclosure. Various signals shown in the timing diagram 300 are labeled on the left side of the diagram, referring to various signals described above and shown in FIG. 2. Thus, the timing diagram 300 illustrates, from top to bottom, the SYSREF signal 101, the device clock signal 111, the PLL clock signal 113, the final digital clock signal 227, the state machine output 219, the flip-flop output 217, the shadow counter output 203, and the LMFC counter output 229. As is conventional with timing diagrams, the time is measured along the horizontal axis of the timing diagram 300. The timing diagram 300 illustrates how the LMFC counter 228 and the shadow counter 202 (i.e., the two different phase accumulators of the system 200) may be synchronized when the system 200 is first initialized/started up/activated. After that, the system 200 may distribute the phase updates for subsequent SYSREF pulses as shown in the timing diagram of FIG. 4.

FIG. 3 illustrates an embodiment where the initial synchronization between the LMFC counter 228 and the shadow counter 202 is performed based on the MCS procedure, as used conventionally to synchronize the LMFC counter 228 to the SYSREF signal 101, although in other embodiments any other procedures to synchronize the initial count of the LMFC counter 228 and the shadow counter 202 may be implemented and are within the scope of the present disclosure. What is different in FIG. 3 from the conventional MCS initial synchronization procedure is the synchronization of the shadow counter 202 to the SYSREF signal 101 and to the LMFC counter 228, as well as the functionality of the state machine 218 with respect to that synchronization.

Figure 4:
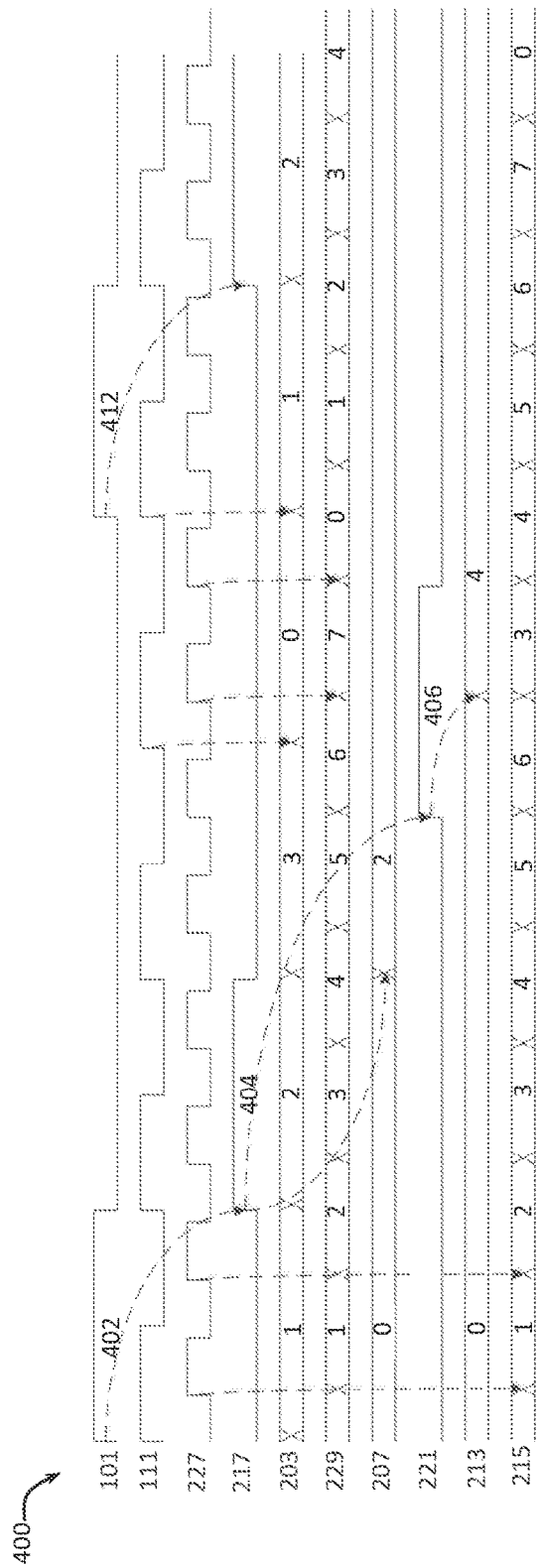
FIG. 4 provides a timing diagram illustrating how arrival of a new SYSREF pulse starts the process of communicating the new phase offset to generate the final phase without synchronous signal transfer, according to some embodiments of the present disclosure.

As shown in FIG. 3, the arrival of a pulse 302 in the SYSREF signal 101 causes a change in the output 217 of the flop-flop 216, i.e., results in a pulse 304 in the output 217 of the flip-flop 216 (the causation shown in the timing diagrams of FIGS. 3 and 4 with a dashed arrows, as in this case is shown between the beginning of the pulse 302 and the beginning of the pulse 304). The flip-flop output 217 is synchronous to the SYSREF signal 101 because both are clocked at the device clock 111. Hence, the final edge of the pulse 302 may be substantially aligned with the end of the cycle of the device clock 111, as shown in FIG. 3, and may further be aligned with the starting edge of the pulse 304 (thus, the starting edge of the pulse 304 may be aligned with the end of the cycle of the device clock 111 when the pulse 302 ended), as also shown in FIG. 3.

In turn, the pulse 304 in the flip-flop output 217 causes a change in the state of, and, therefore, the output 219 of, the state machine 218 from "Ready" to "Stop." As shown in FIG. 3, such a change may happen after one clock cycle of the device clock 111, although in other embodiments, the change in the state of the state machine 218 from "Ready" to "Stop" may take more than one cycle of the device clock 111. As illustrated in FIG. 3, in some embodiments the state machine 218 may operate on the device clock 111. In some embodiments, the state machine 218 may be a state machine with at least 4 states, labeled in FIG. 3 as states "Ready," "Stop," "Reset," and "Done," where the output 219 of the state machine 218 is indicative of those states. When the state machine 218 switches to the "Stop" state, it stops generation of the final digital clock 227 by providing the output 219 indicative of the state machine 218 being in the "Stop" state to the gate 224. The gate 224 then does not pass the PLL clock 113 to the clock divider 226 and the clock divider 226 does not generate the final digital clock 227. This is shown in FIG. 3 with the final digital clock 227 stopping after the output 219 of the state machine 218 switches to indicate that the state machine 218 is in the "Stop" state. As shown in FIG. 3, the state machine 218 may remain in the "Stop" state for the duration of one clock cycle of the device clock 111, although in other embodiments, the state machine 218 may remain in the "Stop" state for the duration of more than one cycle of the device clock 111.

At the end of the "Stop" state, the state machine 218 switches to the "Reset" state. As a result, the output 219 indicative of the reset is provided from the state machine 218 to each of the shadow counter 202 and the LMFC counter 228 (as shown in FIG. 2 with respective arrows labeled "Reset"), which causes the output 203 of the shadow counter 202 and the output 229 of the LMFC counter 228 to be reset to some initial values. The initial values for both are shown in FIG. 3 as values of 0, although in other embodiments the initial value for any of the shadow counter 202 and the LMFC counter 228 may be any other value (e.g., any other integer value), and, in general, the initial values of the shadow counter 202 and the LMFC counter 228 may, but do not have to be, the same. The generation of the final digital clock 227 by the clock divider 226 may remain off when the state machine 218 is in the "Reset" state, as shown in FIG. 3. As shown in FIG. 3, the state machine 218 may remain in the "Reset" state for the duration of one clock cycle of the device clock 111, although in other embodiments, the state machine 218 may remain in the "Reset" state for the duration of more than one cycle of the device clock 111.

At the end of the "Reset" state, the state machine 218 switches to the "Done" state. When the state machine 218 switches to the "Done" state, it starts generation of the final digital clock again by providing the output signal 219 indicative of the state machine 218 being in the "Done" state to the gate 224. The gate 224 then passes the PLL clock 113 to the clock divider 226 and the clock divider 226 generates the final digital clock 227. This is shown in FIG. 3 with the final digital clock signal 227 starting again after the state machine 218 switches to the "Done" state. Since the final digital clock runs again, the LMFC counter 228 starts counting the cycles of the final digital clock 227 starting from the initial value. This is shown in FIG. 3 with the arrow between the re-start of the final digital clock 227 after the state machine 218 switched to the "Done" state and the output value 229 of the LMFC counter 228 being incremented by 1 from the initial value (i.e., to the value of 1, for the example shown in FIG. 3 where the initial value of the LMFC counter 228 was 0). Similarly, after the state machine 218 switches to the "Done" state, the shadow counter 202 also starts counting the cycles, but of the device clock 111 (since the shadow counter 202 runs on the device clock 111), starting from the initial value. This is shown in FIG. 3 with the arrow between the end of the first cycle of the device clock 111 after the state machine 218 switched to the "Done" state and the output value 203 of the shadow counter 202 being incremented by 1 from the initial value (i.e., to the value of 1, for the example shown in FIG. 3 where the initial value of the shadow counter 202 was 0).

FIG. 4 provides a timing diagram 400 illustrating how arrival of a new SYSREF pulse 402 of the SYSREF signal 101 starts the process of communicating the new phase offset to generate the final phase 215 without synchronous signal transfer, according to some embodiments of the present disclosure. Similar to FIG. 3, various signals shown in the timing diagram 400 are labeled on the left side of the diagram of FIG. 4, referring to various signals described above and shown in FIG. 2. Thus, the timing diagram 400 illustrates, from top to bottom, the SYSREF signal 101, the device clock signal 111, the final digital clock signal 227, the flip-flop output 217, the shadow counter output 203, the LMFC counter output 229, the transmit copy component output 207, the synchronization component output 221, the receive copy component output 213, and the final phase 215 (i.e., the output 215 of the combiner 214).

The new SYSREF pulse 402 may, e.g., be the next pulse in the SYSREF signal 101 after the system 200 have been initialized and the shadow counter 202 and the LMFC counter 228 started counting at the same time, e.g., as was shown in FIG. 3. Consider an example shown in FIG. 4 where right before the arrival of the pulse 402, the value of the shadow counter 202 is 0 and the value of the LMFC counter is also 0, although, in other embodiments, these values may be different and do not have to be the same.

As shown in FIG. 4, arrival of a pulse 402 in the SYSREF signal 101 causes a change in the output of the flip-flop 216, i.e., results in a pulse 404 in the flip-flop output 217. This is illustrated in FIG. 4 with a dashed arrow from the beginning of the pulse 402 to the beginning of the pulse 404. In turn, the pulse 404 in the flip-flop output 217 causes a number of actions in the system 200. One action is that the pulse 404 in the flip-flop output 217 causes a pulse 406 in the output 221 of the synchronization component 220 because the flip-flop output 217 is provided to the synchronization component 220 as a phase update. This is illustrated in FIG. 4 with a dashed arrow from the beginning of the pulse 404 to the beginning of the pulse 406. The pulses 404 and 406 are not aligned because the flip-flop 216 and the synchronization component 220 are not synchronous (the former is clocked on the device clock 111 and the latter is clocked on the final digital clock 227). Another action caused by the pulse 404 in the flip-flop output 217 is a change in the output 207 of the transmit copy component 206 because the flip-flop output 217 is provided to the multiplexer 204 associated with the transmit copy component 206. This is illustrated in FIG. 4 with a dashed arrow from the beginning of the pulse 404 to the change in the transmit copy component output 207. The change in the transmit copy component output 207 is aligned with the end of the pulse 404 because the flip-flop 216 and the transmit copy component 206 are synchronous (i.e., both are clocked on the device clock 111). Because, for the example of FIG. 4, at the end of the pulse 404 the value of the shadow counter 202 is 2, the transmit copy component output 207 changes from whatever the previous output it might have had (e.g., the value of 0, for the example shown in FIG. 4) to the value of the shadow counter 202, i.e., to 2. Thus, the transmit copy component 206 in combination with the multiplexer 204 may be seen as the multiplexer 204 keeping the output 207 of the transmit copy component 206 at whatever the last output was or keeping it at some predefined initial value (e.g., 0), for the time duration before the new SYSREF pulse (e.g., the pulse 402) of the SYSREF signal 101 comes, as the shadow counter 202 continues counting, and only let the latest value of the output 203 of the shadow counter 202 to be loaded to the transmit copy component 206 when the new SYSREF pulse arrives.

The shadow counter 202 continues counting in the sequence of values that the shadow counter 202 is configured to go through. Such a sequence is shown in the example of FIG. 4 as 0, 1, 2, 3, after which the sequence repeats, although in other embodiments the shadow counter 202 may count to more than 3 or less than 3. Similarly, FIG. 4 illustrates the LMFC counter 228 to count through the sequence of 0, 1, 2, 3, 4, 5, 6, 7, after which the sequence repeats, although in other embodiments the LMFC counter 228 may count to more than 7 or less than 7. Thus, at a given time, the output 203 of the shadow counter 202 is one of the values of the sequence of values through which the shadow counter 202 is configured to count before re-starting the sequence again (e.g., the sequence of 0, 1, 2, 3, 4), while the output 229 of the LMFC counter 228 is one of the values of the sequence of values through which the LMFC counter 228 is configured to count before re-starting the sequence again (e.g., the sequence of 0, 1, 2, 3, 4, 5, 6, 7).

Another action indirectly caused by the pulse 404 is that the value of the output 213 of the receive copy 212 changes. This is illustrated in FIG. 4 with a dashed arrow from the beginning of the pulse 406 (which was caused by the pulse 404) to the change in the receive copy output 213. The scaling component 208 may be a component configured to change the value of the output 207 of the transmit copy component 206 (i.e., the latest value of the shadow counter 202), counted on the device clock 111, to reflect the difference between the period of the device clock 111 and the period of the final digital clock 227 that is used by the LMFC counter 228. For the example shown in FIGS. 3 and 4, the final digital clock 227 is twice as fast as the device clock 111 (which can be seen in the illustrations of FIGS. 3 and 4 even though these two clock signals are not synchronous). Therefore, as a result of the pulse 406, the output 209 of the scaling component 208 changes to 4 (i.e., twice the output 207 of the transmit copy component 206 at the time when the pulse 406 begins). The output 209 of the scaling component 208 is provided to the multiplexer 210. Also, the output 221 of the synchronization component 220 is provided to the multiplexer 210. The multiplexer 210 is configured to pass the value of the output 209 of the scaling component 208 to the receive copy component 212 after the pulse 406 in the output of the synchronization component 220 begins. The receive copy component 212 is configured to output the value of the output 209 of the scaling component 208 that has been loaded thereto after the pulse 406 begins. In other words, the receive copy component 212 is configured to pass its' input received from the scaling component 208 to its output.

The output 213 of the receive copy component 212 is provided to the combiner 214 which generates the output 215 that is the final phase. The final phase 215 (i.e., the output of the combiner 214) is shown in the last line of FIG. 4. As shown in FIG. 4, at first the final phase 215 goes through the sequence 1, 2, 3, 4, 5, and 6, corresponding to the counter values of the LMFC counter 228 because the receive copy input and, hence, the receive copy output, is 0. When the output 209 of the scaling component 208 changes to the value of 4 as described above, and because the combiner 214 is assumed, in this example, to add the values received from the LMFC counter 228 and the receive copy 212, the final phase 215 does not change from 6 to 7 as it would have if there was no pulse 406, but changes from 6 to 3, where 3 is a result of adding the values of 7 and 4 in the sequence through which the LMFC counter 228 counts (i.e., 7+4=11, but, for the example shown in FIG. 4, the LMFC counter 228 only counts to 7 and then starts the counting sequence at 0 again, so 7 plus another 4 counts means the value of 3). After that, the final phase 215 continues to change with the counts (i.e., output 229) of the LMFC counter 228 until a new SYSREF pulse 412 comes and the phase update process starts from the beginning as was described with respect to the pulse 402.

Example Systems and Devices

Figure 6:
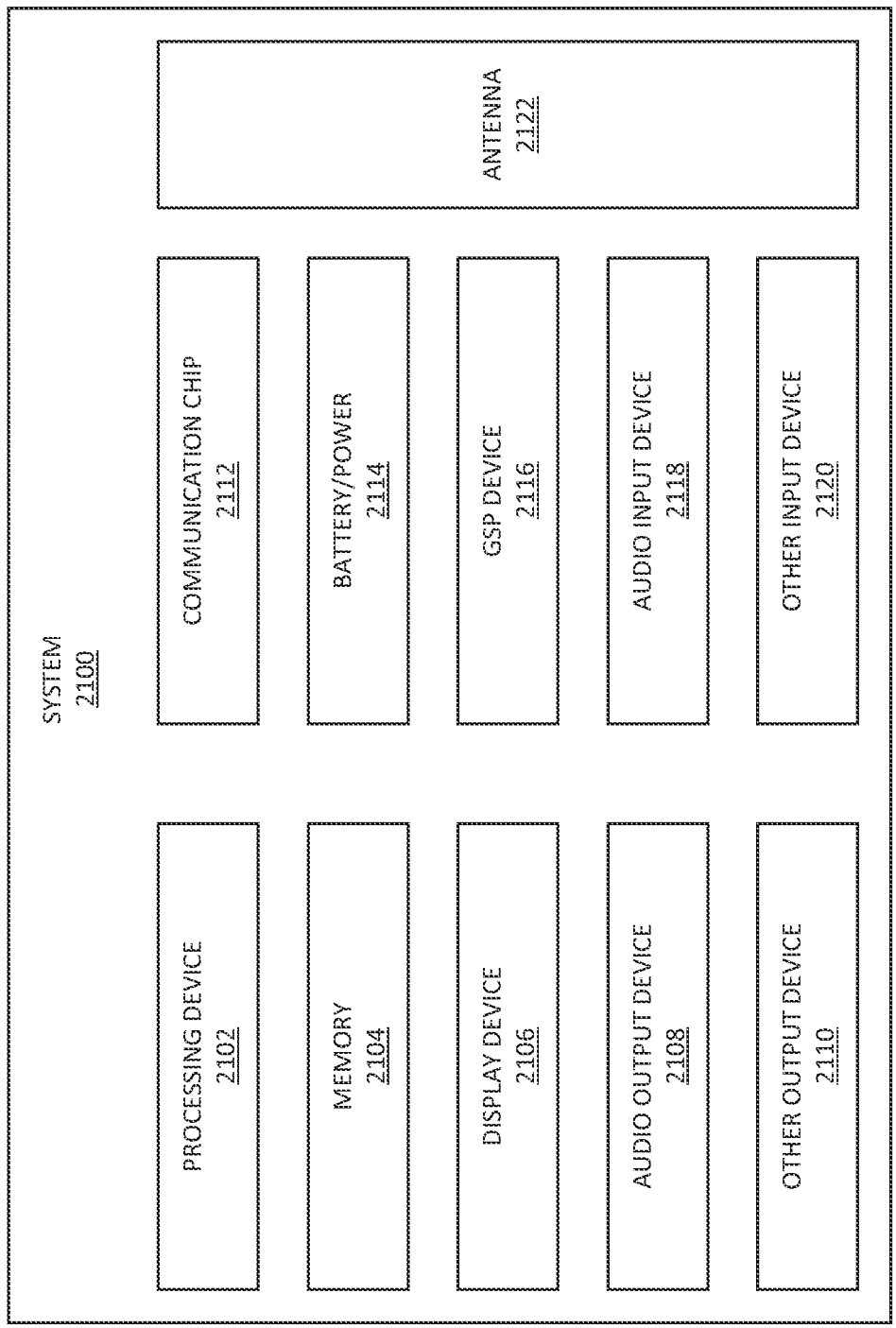
FIG. 6 is a block diagram of an example system that may include one or more systems configured to provide phase synchronization updates without synchronous signal transfer, according to some embodiments of the present disclosure.
Figure 7:
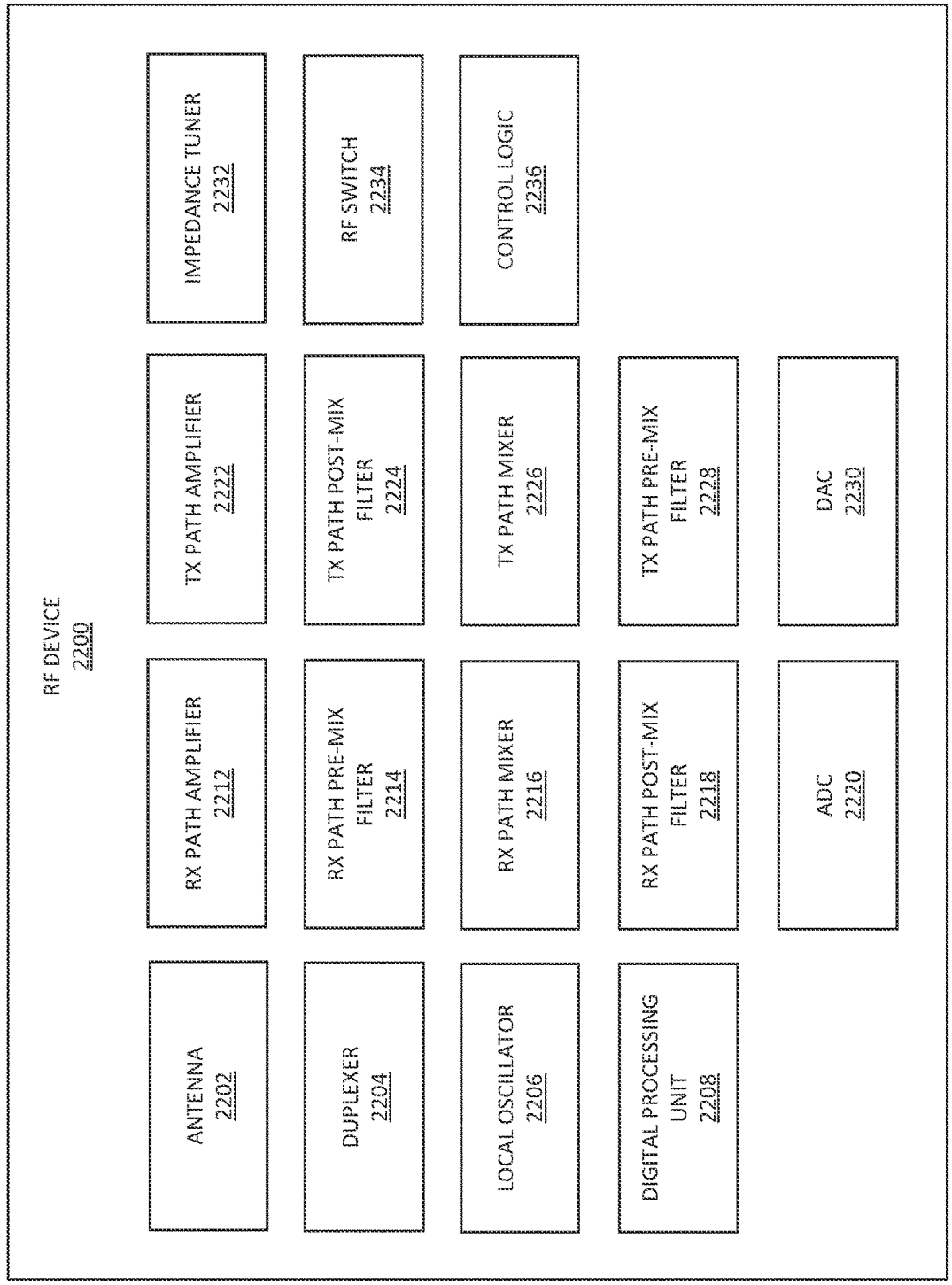
FIG. 7 is a block diagram of an example radio frequency (RF) device that may include one or more systems configured to provide phase synchronization updates without synchronous signal transfer, according to some embodiments of the present disclosure.

The system 200 may be implemented in any electronic device or system where distribution of phase updates of the SYSREF signal 101 may be desirable. Some examples of such devices/systems are shown in FIGS. 5-7.

In some embodiments, the system 200 may be implemented in a radio system. Radio systems are systems that transmit and receive signals in the form of electromagnetic waves in the RF range of approximately 3 kilohertz (kHz) to 300 gigahertz (GHz). Radio systems may be used in a myriad of different applications, such as airplane, automotive and industrial radar, cellular technology, Wi-Fi and other short-range communication technologies, and military applications. One example is shown in FIG. 5, providing a schematic illustration of an electronic device 500 that includes an RF transceiver 510 and a baseband IC (BBIC) 520, coupled to the RF transceiver 510 using, e.g., a high-speed serial interface 535 supported by JESD.

Figure 5:
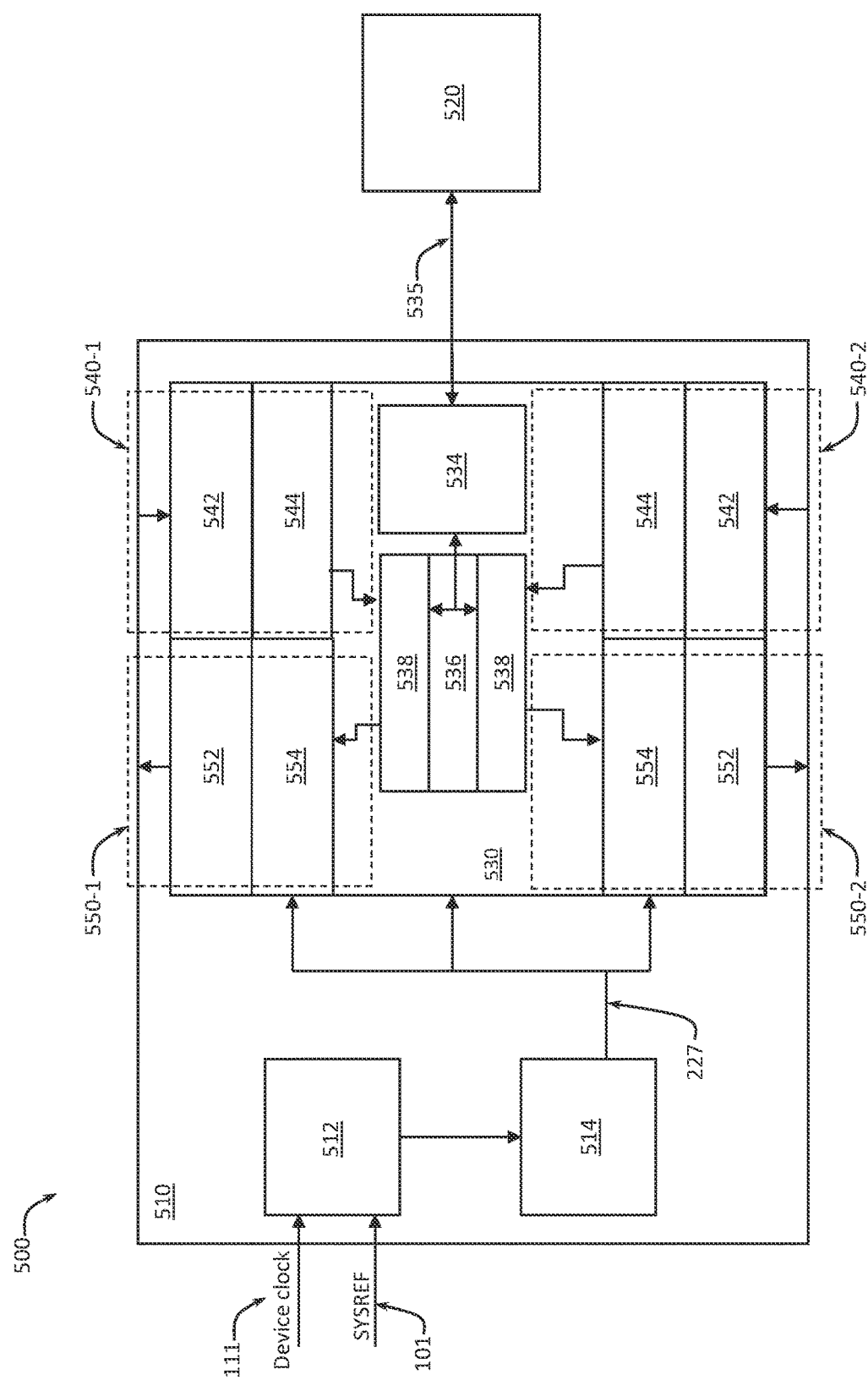
FIG. 5 provides a schematic illustration of an electronic device in which phase synchronization updates without synchronous signal transfer may be implemented, according to some embodiments of the present disclosure.

As shown in FIG. 5, the RF transceiver 510 may include a device clock circuitry component 512 and a PLL and clock divider circuit 514. As also shown in FIG. 5, the RF transceiver 510 may further include, and a digital component 530. The digital component 530 may include a JESD component 534, a digital core 536, one or more digital data paths 538. The RF transceiver 510 may further include one or more receive (RX) paths 540 (shown in FIG. 2 as two RX paths, labeled 540-1 and 540-2), and one or more transmit (TX) paths 550 (shown in FIG. 2 as two TX paths, labeled 550-1 and 550-2). Each RX path 540 may include a RX mixer and filter circuit 542 and a RX converter circuit 544. Each TX path 550 may include a TX mixer and filter circuit 552 and a TX converter circuit 554. In some embodiments, the RX mixer and filter circuit 542 may include an RX path amplifier 2212, an RX path pre-mix filter 2214, an RX path mixer 2216, and an RX path post-mix filter 2218, as described with reference to FIG. 7, while the RX converter circuit 544 may include an analog-to-digital converter (ADC) 2220, as also described with reference to FIG. 7. In some embodiments, the TX mixer and filter circuit 552 may include a TX path amplifier 2222, a TX path post-mix filter 2224, a TX path mixer 2226, and a TX path pre-mix filter 2228, as described with reference to FIG. 7, while the TX converter circuit 554 may include a digital-to-analog converter (DAC) 2230, as also described with reference to FIG. 7. The RX converter circuit 544 may be coupled to the digital component 530 and to the RX mixer and filter circuit 542, and the RX mixer and filter circuit 542 may be further coupled to one or more antennas (not shown in FIG. 5, but such antennas may be implemented as an antenna 2202, described with reference to FIG. 7) configured to wirelessly receive RF signals as described in greater detail with reference to FIG. 7. The TX converter circuit 554 may be coupled to the digital component 530 and to the TX mixer and filter circuit 552, and the TX mixer and filter circuit 552 may be further coupled to one or more antennas configured to wirelessly transmit RF signals as described in greater detail with reference to FIG. 7. The digital component 530 may include one or more of the digital processing unit 2208, the control logic 2236, and various other digital components of the RF device 2200 of FIG. 7.

In various embodiments, components of the system 200 may be implemented in different portions of the RF transceiver 510. For example, the shadow counter 202 may be implemented in the device clock circuitry component 512, while the LMFC counter 228 may be implemented in the JESD component 534. The PLL 222, the gate 224, and the clock divider 226 may be implemented in the PLL and clock divider circuit 514. Various other portions of the system 200 may be included in other portions of the RF transceiver 510.

The PLL and clock divider circuit 514 may be configured to provide the final digital clock 227 to various components of the RF transceiver 510, such as to the digital component 530, as well as to the RX paths 540 and the TX paths 550. These components may also receive the phase update by the way of receiving the final phase as described herein. Then the components may use the final phase 215 to time their operation with respect to the SYSREF signal 101, thus getting synchronized with respect to the SYSREF signal 101 and, therefore, with respect to one another. In some embodiments, such synchronization using the final phase 215 may be performed as known in the art based on the final phase provided by conventional LMFC counters (e.g., such as that described with reference to FIG. 1), as known in the art. In some embodiments, synchronization between various IC components of a system may be performed as follows. For example, consider that each of IC components 1 and 2 is configured to operate at the final digital clock 227 and is configured to receive the final phase 215. The final phase 215 goes through a sequence of counts at the rate of the final digital clock 227 (i.e., at every cycle of the final digital clock 227, the final phase 215 switches to the next counter value in the sequence, where the sequence may, e.g., be 0, 1, 2, 3, 4, 5, 6, 7, as is in the example described above). The system may be configured so that the IC components 1 and 2 are supposed to take a certain action when the final phase provided to them is at a certain count (e.g., at a count of 2). For example, the action could be that a certain state of the IC components 1 and 2 gets reset when the final phase 215 is at a certain count. In some embodiments, the state which gets reset in this manner may be the multiframe boundary, which decides which frame or set of samples is the first in the sequence. This is important for the framer of the system because it needs to start a multiframe boundary at a deterministic time, such that when the deframer queues up its samples and releases the start of a multiframe on its LMFC, there is a deterministic latency between when the framer sent the first sample in a multiframe and when the deframer released it to the data path. Both framer and deframer chips need to align their LMFC counters deterministically with SYSREF signal for this to work. Once all that is in place, the entire latency over the JESD link is deterministic despite the presence of asynchronous crossings and undefined routing delays in the traces on the board, etc.

FIG. 6 is a block diagram of an example system 2100 that may include one or more systems configured to provide phase synchronization updates without synchronous signal transfer, in accordance with any of the embodiments disclosed herein. For example, any suitable ones of the components of the system 2100 may include one or more of the system 200 and/or the device 500 as disclosed herein. A number of components are illustrated in FIG. 6 as included in the system 2100, but any one or more of these components may be omitted or duplicated, as suitable for the application. In some embodiments, some or all of the components included in the system 2100 may be attached to one or more motherboards. In some embodiments, some or all of these components are fabricated onto a single system-on-a-chip (SOC) die.

Additionally, in various embodiments, the system 2100 may not include one or more of the components illustrated in FIG. 6, but the system 2100 may include interface circuitry for coupling to the one or more components. For example, the system 2100 may not include a display device 2106, but may include display device interface circuitry (e.g., a connector and driver circuitry) to which a display device 2106 may be coupled. In another set of examples, the system 2100 may not include an audio input device 2118 or an audio output device 2108 but may include audio input or output device interface circuitry (e.g., connectors and supporting circuitry) to which an audio input device 2118 or audio output device 2108 may be coupled.

The system 2100 may include a processing device 2102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The system 2100 may include a memory 2104, which may itself include one or more memory devices such as volatile memory (e.g., dynamic random access memory (RAM) (DRAM)), non-volatile memory (e.g., read-only memory (ROM)), flash memory, solid state memory, and/or a hard drive. In some embodiments, the memory 2104 may include memory that shares a die with the processing device 2102. This memory may be used as cache memory and may include embedded DRAM (eDRAM) or spin transfer torque magnetic RAM (STT-MRAM).

In some embodiments, the system 2100 may include a communication chip 2112 (e.g., one or more communication chips). For example, the communication chip 2112 may be configured for managing wireless communications for the transfer of data to and from the system 2100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2112 may operate in accordance with other wireless protocols in other embodiments. The system 2100 may include an antenna 2122 to facilitate wireless communications and/or to receive other wireless communications (such as AM or FM radio transmissions).

In some embodiments, the communication chip 2112 may manage wired communications, such as electrical, optical, or any other suitable communication protocols (e.g., the Ethernet). As noted above, the communication chip 2112 may include multiple communication chips. For instance, a first communication chip 2112 may be dedicated to shorter-range wireless communications such as Wi-Fi or Bluetooth, and a second communication chip 2112 may be dedicated to longer-range wireless communications such as global positioning system (GPS), EDGE, GPRS, CDMA, WiMAX, LTE, EV-DO, or others. In some embodiments, a first communication chip 2112 may be dedicated to wireless communications, and a second communication chip 2112 may be dedicated to wired communications.

The system 2100 may include battery/power circuitry 2114. The battery/power circuitry 2114 may include one or more energy storage devices (e.g., batteries or capacitors) and/or circuitry for coupling components of the system 2100 to an energy source separate from the system 2100 (e.g., AC line power).

The system 2100 may include a display device 2106 (or corresponding interface circuitry, as discussed above). The display device 2106 may include any visual indicators, such as a heads-up display, a computer monitor, a projector, a touchscreen display, a liquid crystal display (LCD), a light-emitting diode display, or a flat panel display.

The system 2100 may include an audio output device 2108 (or corresponding interface circuitry, as discussed above). The audio output device 2108 may include any device that generates an audible indicator, such as speakers, headsets, or earbuds.

The system 2100 may include an audio input device 2118 (or corresponding interface circuitry, as discussed above). The audio input device 2118 may include any device that generates a signal representative of a sound, such as microphones, microphone arrays, or digital instruments (e.g., instruments having a musical instrument digital interface (MIDI) output).

The system 2100 may include a GPS device 2116 (or corresponding interface circuitry, as discussed above). The GPS device 2116 may be in communication with a satellite-based system and may receive a location of the system 2100, as known in the art.

The system 2100 may include another output device 2110 (or corresponding interface circuitry, as discussed above). Examples of the other output device 2110 may include an audio codec, a video codec, a printer, a wired or wireless transmitter for providing information to other devices, or an additional storage device.

The system 2100 may include another input device 2120 (or corresponding interface circuitry, as discussed above). Examples of the other input device 2120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The system 2100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the system 2100 may be any other electronic device that processes data.

FIG. 7 is a block diagram of an example RF device 2200 that may include one or more components with one or more systems configured to provide phase synchronization updates without synchronous signal transfer in accordance with any of the embodiments disclosed herein. For example, any suitable ones of the components of the RF device 2200 may include a die including at least one system, or a portion thereof, configured to provide phase synchronization updates without synchronous signal transfer in accordance with any of the embodiments disclosed herein. In some embodiments, the RF device 2200 may be included within any components of the system 2100 as described with reference to FIG. 6 or may be coupled to any of the components of the system 2100, e.g., be coupled to the memory 2104 and/or to the processing device 2102 of the system 2100. In still other embodiments, the RF device 2200 may further include any of the components described with reference to FIG. 6, such as, but not limited to, the battery/power circuit 2114, the memory 2104, and various input and output devices as shown in FIG. 6.

In general, the RF device 2200 may be any device or system that may support wireless transmission and/or reception of signals in the form of electromagnetic waves in the RF range of approximately 3 kilohertz (kHz) to 300 gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 7 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all of the components included in the RF device 2200 may be attached to one or more motherboards. In some embodiments, some or all of these components are fabricated on a single die, e.g., on a single SOC die.

Additionally, in various embodiments, the RF device 2200 may not include one or more of the components illustrated in FIG. 7, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 7, the RF device 2200 may include an antenna 2202, a duplexer 2204, a local oscillator 2206, a digital processing unit 2208. As also shown in FIG. 7, the RF device 2200 may include an RX path that may include an RX path amplifier 2212, an RX path pre-mix filter 2214, a RX path mixer 2216, an RX path post-mix filter 2218, and an ADC 2220. As further shown in FIG. 7, the RF device 2200 may include a TX path that may include a TX path amplifier 2222, a TX path post-mix filter 2224, a TX path mixer 2226, a TX path pre-mix filter 2228, and a DAC 2230. Still further, the RF device 2200 may further include an impedance tuner 2232, an RF switch 2234, and control logic 2236. In various embodiments, the RF device 2200 may include multiple instances of any of the components shown in FIG. 7. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 7) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 7 as control logic 2236, e.g., an RF FE control interface. In some embodiments, the control logic 2236 may be configured to control at least portions of operating any of the systems configured to provide phase synchronization updates without synchronous signal transfer, as described herein, within any components of the RF device 2200. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. In some embodiments, the digital processing unit 2208 may be implemented as the processing device 2102 shown in FIG. 6, descriptions of which are provided above (when used as the digital processing unit 2208, the processing device 2102 may, but does not have to, implement any of the systems configured to provide phase synchronization updates without synchronous signal transfer as described herein). The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 7, in some embodiments, the RF device 2200 may further include a memory device, e.g., the memory device 2104 as described with reference to FIG. 6, configured to cooperate with the digital processing unit 2208. When used within, or coupled to, the RF device 2200, the memory device 2104 may, but does not have to, implement any of the systems configured to provide phase synchronization updates without synchronous signal transfer as described herein.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 7, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, similar to the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Similar to the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Similar to the RX path mixer 2216, the TX path mixer 2226 may include a pair of TX path mixers, for in-phase and quadrature component mixing. Similar to the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may be a power amplifier (PA), configured to amplify the upconverted RF signal before providing it to the antenna 2202 for transmission.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 7, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 7 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable PLL, configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path. One or more systems configured to provide phase synchronization updates without synchronous signal transfer, described herein, may be included to provide phase updates for operation of one of more of these components.

Example Data Processing System

Figure 8:
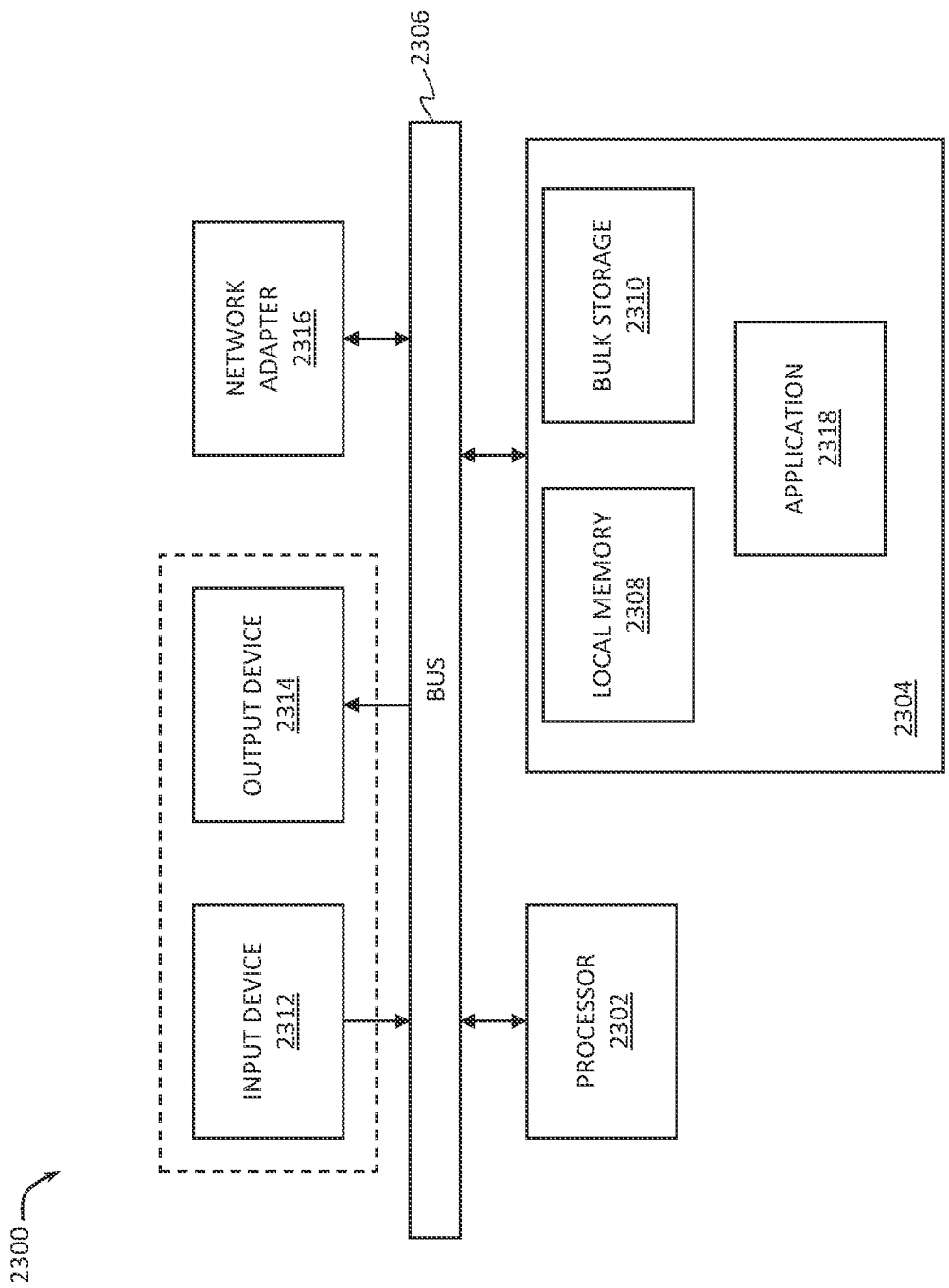
FIG. 8 provides a block diagram illustrating an example data processing system that may be configured to control operation of one or more systems configured to provide phase synchronization updates without synchronous signal transfer, according to some embodiments of the present disclosure.

FIG. 8 provides a block diagram illustrating an example data processing system 2300 that may be configured to control operation of one or more systems configured to provide phase synchronization updates without synchronous signal transfer, according to some embodiments of the present disclosure. For example, the data processing system 2300 may be configured to implement or control portions of the system 200 and/or the device 500 as described herein. In some embodiments, the data processing system 2300 may be configured to implement the control logic 2236, shown in FIG. 7.

As shown in FIG. 8, the data processing system 2300 may include at least one processor 2302, e.g., a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to providing phase synchronization updates without synchronous signal transfer, as described herein. The processor 2302 may include any combination of hardware, software, or firmware providing programmable logic, including by way of non-limiting example a microprocessor, a DSP, a field-programmable gate array (FPGA), a programmable logic array (PLA), an application-specific IC (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) RAM, synchronous RAM (SRAM), dynamic RAM (DRAM), flash, ROM, optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements of system 200 and/or the device 500, can also include suitable interfaces for receiving, transmitting, and/or otherwise communicating data or information in a network environment so that they can communicate with, e.g., the data processing system 2300.

In certain example implementations, mechanisms for realizing phase synchronization updates without synchronous signal transfer as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 2304 shown in FIG. 8, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 2302 shown in FIG. 8, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 8, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 8) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, LCD, organic light-emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 8 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

SELECT EXAMPLES

The following paragraphs provide various examples of the embodiments disclosed herein.

Example 1 provides a system for generating phase updates for synchronization of IC components. The system includes a PLL circuit, configured to receive a device clock signal and generate a PLL clock signal having a frequency greater than that of the device clock signal; a clock divider circuit, configured to generate a final digital clock signal based on the PLL clock signal; a first phase accumulator, configured to generate a first phase update based on (e.g., by being clocked at) the final digital clock signal; a second phase accumulator, configured to generate a second phase update based on (e.g., by being clocked at) the device clock signal, where each of the first phase update and the second phase update is indicative of an arrival of a pulse of a SYSREF signal; and a combiner, configured to generate the phase update based on the first phase update and the second phase update.

Example 2 provides the system according to example 1, further including an input component, configured to receive the SYSREF signal and provide an output signal that includes a pulse indicative of the pulse of the SYSREF signal.

Example 3 provides the system according to example 2, where the input component is a delay flip-flop (DFF0).

Example 4 provides the system according to examples 2 or 3, further including a transmit copy component, configured to generate a transmit copy output indicative of a value of the second phase update at a falling edge of the pulse of the output signal of the input component.

Example 5 provides the system according to example 4, where the transmit copy component includes a multiplexer and one or more DFFs.

Example 6 provides the system according to examples 4 or 5, further including a state machine, configured to control operation of the transmit copy component based on the arrival of the pulse of the SYSREF signal.

Example 7 provides the system according to any one of examples 2-6, further including a scaling component, configured to generate a scaling component output indicative of a scaled value of the second phase update at a falling edge of the pulse of the output signal of the input component, where the scaled value is based on a difference between the final digital clock signal and the device clock signal.

Example 8 provides the system according to any one of examples 2-7, further including a synchronization component, configured to generate a pulse based on the pulse of the output signal of the input component, where the pulse generated by the synchronization component is configured to trigger provision of the second phase update to the combiner.

Example 9 provides the system according to example 2, further including a scaling component, configured to generate a scaling component output indicative of a scaled value of the second phase update at a falling edge of the pulse of the output signal of the input component, where the scaled value is based on a difference between the final digital clock signal and the device clock signal; and a synchronization component, configured to trigger provision of the scaled value to the combiner.

Example 10 provides the system according to example 2, further including a transmit copy component, configured to generate a transmit copy output indicative of a value of the second phase update at a falling edge of the pulse of the output signal of the input component; and a synchronization component, configured to trigger provision of a value indicative of the value of the second phase update at the falling edge of the pulse of the output signal of the input component to the combiner.

Example 11 provides the system according to any one of the preceding examples, further including a state machine, configured to control operation of one or more of the first phase accumulator, the second phase accumulator, and the clock divider circuit based on the arrival of the pulse of the SYSREF signal.

Example 12 provides the system according to any one of the preceding examples, further including a gate, coupled between the PLL and the clock divider circuit and configured to provide the PLL clock signal to the clock divider circuit; and a state machine, configured to trigger the gate to provide the PLL clock signal to the clock divider circuit (to trigger the clock divider circuit to generate the final digital clock signal) based on the arrival of the pulse of the SYSREF signal.

Example 13 provides the system according to any one of the preceding examples, where, at a given time, the combiner is configured to generate the phase update by adding a value of the first phase update and a value of the second phase update.

Example 14 provides the system according to any one of the preceding examples, where the first phase accumulator is an LMFC.

Example 15 provides the system according to any one of the preceding examples, where the SYSREF signal is a SYSREF signal of JESD standard.

Example 16 provides the system according to any one of the preceding examples, where the system is an RF transceiver.

Example 17 provides the system according to example 16, where the RF transceiver further includes the IC components, the IC components include at least one of a frequency mixer, an ADC, a DAC, an analog filter, and a digital filter, and the RF transceiver is configured to synchronize one or more of the IC components based on the phase update generated by the combiner.

Example 18 provides a timing arrangement for synchronizing one or more IC components. The timing arrangement includes a first counter, configured to count a number of cycles of a final digital clock signal, where the final digital clock signal is based on a PLL clock signal, the PLL clock signal is based on a device clock signal, and a frequency of the final digital clock signal is greater than a frequency of the device clock signal; a second counter, configured to count a number of cycles of the device clock signal; and a phase update circuit, configured to generate a phase update indicative of an arrival of a pulse of a SYSREF signal based on outputs of the first counter and the second counter.

Example 19 provides the timing arrangement according to example 18, where the phase update circuit is configured to generate the phase update in absence of providing the SYSREF signal to the first counter.

Example 20 provides the timing arrangement according to examples 18 or 19, where the first counter is configured to count the number of cycles of the final digital clock signal by repeating a first sequence of count values, and the second counter is configured to count the number of cycles of the device clock signal by repeating a second sequence of count values, the second sequence being different from the first sequence.

Variations and Implementations

While embodiments of the present disclosure were described above with references to exemplary implementations as shown in FIGS. 2-8, a person skilled in the art will realize that the various teachings described above are applicable to a large variety of other implementations.

In the discussions of the embodiments above, components of a system, such as e.g., combiners/adders, flip-flops, multiplexers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to providing phase synchronization updates without synchronous signal transfer.

Parts of various systems for implementing phase synchronization updates without synchronous signal transfer as proposed herein can include electronic circuitry to perform the functions described herein. In some cases, one or more parts of the system can be provided by a processor specially configured for carrying out the functions described herein. For instance, the processor may include one or more application-specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry configured to perform a specific application or function) or implemented as plug-in modules into application-specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

All of the specifications, dimensions, and relationships outlined herein (e.g., the number of components of the various devices and systems for providing phase synchronization updates without synchronous signal transfer, or portions of such devices and systems, shown in the present drawings, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Furthermore, functions related to providing phase synchronization updates without synchronous signal transfer as proposed herein illustrate only some of the possible functions that may be executed by, or within, system illustrated in the present figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

The invention claimed is:

1. A system for generating phase updates for synchronization of integrated circuit (IC) components, the system comprising:
   a phase-locked loop (PLL) circuit, configured to receive a device clock signal and generate a PLL clock signal having a frequency greater than that of the device clock signal;
   a clock divider circuit, configured to generate a final digital clock signal based on the PLL clock signal;
   a first phase accumulator, configured to generate a first phase update based on the final digital clock signal;
   a second phase accumulator, configured to generate a second phase update based on the device clock signal, where each of the first phase update and the second phase update is indicative of an arrival of a pulse of a system reference (SYSREF) signal; and
   a combiner, configured to generate the phase update based on the first phase update and the second phase update.

2. The system according to claim 1, further comprising an input component, configured to receive the SYSREF signal and provide an output signal that includes a pulse indicative of the pulse of the SYSREF signal.

3. The system according to claim 2, wherein the input component is a flip-flop.

4. The system according to claim 2, further comprising a transmit copy component, configured to generate a transmit copy output indicative of a value of the second phase update at a falling edge of the pulse of the output signal of the input component.

5. The system according to claim 4, wherein the transmit copy component includes a multiplexer and one or more flip-flops.

6. The system according to claim 4, further comprising a state machine, configured to control operation of the transmit copy component based on the arrival of the pulse of the SYSREF signal.

7. The system according to claim 2, further comprising a scaling component, configured to generate a scaling component output indicative of a scaled value of the second phase update at a falling edge of the pulse of the output signal of the input component, wherein the scaled value is based on a difference between the final digital clock signal and the device clock signal.

8. The system according to claim 2, further comprising a synchronization component, configured to generate a pulse based on the pulse of the output signal of the input component, wherein the pulse generated by the synchronization component is configured to trigger provision of the second phase update to the combiner.

9. The system according to claim 2, further comprising:
   a scaling component, configured to generate a scaling component output indicative of a scaled value of the second phase update at a falling edge of the pulse of the output signal of the input component, wherein the scaled value is based on a difference between the final digital clock signal and the device clock signal; and
   a synchronization component, configured to trigger provision of the scaled value to the combiner.

10. The system according to claim 2, further comprising:
    a transmit copy component, configured to generate a transmit copy output indicative of a value of the second phase update at a falling edge of the pulse of the output signal of the input component; and
    a synchronization component, configured to trigger provision of a value indicative of the value of the second phase update at the falling edge of the pulse of the output signal of the input component to the combiner.

11. The system according to claim 1, further comprising a state machine, configured to control operation of one or more of the first phase accumulator, the second phase accumulator, and the clock divider circuit based on the arrival of the pulse of the SYSREF signal.

12. The system according to claim 1, further comprising:
    a gate configured to provide the PLL clock signal to the clock divider circuit; and
    a state machine configured to trigger the gate to provide the PLL clock signal to the clock divider circuit based on the arrival of the pulse of the SYSREF signal.

13. The system according to claim 1, wherein the combiner is configured to generate the phase update by adding the first phase update and the second phase update.

14. The system according to claim 1, wherein the first phase accumulator is a local multiframe clock.

15. The system according to claim 1, wherein the SYSREF signal is a SYSREF signal of JESD standard.

16. The system according to claim 1, wherein the system is a radio frequency (RF) transceiver.

17. The system according to claim 16, wherein:
    the RF transceiver further includes the IC components,
    the IC components include at least one of a frequency mixer, an analog-to-digital converter, a digital-to-analog converter, an analog filter, and a digital filter, and
    the RF transceiver is configured to synchronize one or more of the IC components based on the phase update generated by the combiner.

18. A timing arrangement for synchronizing one or more integrated circuit (IC) components, comprising:
    a first counter, configured to count a number of cycles of a final digital clock signal, wherein the final digital clock signal is based on a phase-locked loop (PLL) clock signal, the PLL clock signal is based on a device clock signal, and a frequency of the final digital clock signal is greater than a frequency of the device clock signal;
    a second counter, configured to count a number of cycles of the device clock signal; and
    a phase update circuit, configured to generate a phase update indicative of an arrival of a pulse of a system reference (SYSREF) signal based on outputs of the first counter and the second counter.

19. The timing arrangement according to claim 18, wherein the phase update circuit is configured to generate the phase update in absence of providing the SYSREF signal to the first counter.

20. The timing arrangement according to claim 18, wherein:
- the first counter is configured to count the number of cycles of the final digital clock signal by repeating a first sequence of count values,
- the second counter is configured to count the number of cycles of the device clock signal by repeating a second sequence of count values, the second sequence being different from the first sequence.

* * * * *